United States Patent [19]

Kryder

[11] 4,008,463
[45] Feb. 15, 1977

[54] INTEGRATED BUBBLE NUCLEATOR

[75] Inventor: Mark Howard Kryder, Yorktown Heights, N.Y.

[73] Assignee: International Business Machines Corporation, Armonk, N.Y.

[22] Filed: June 30, 1975

[21] Appl. No.: 591,999

[52] U.S. Cl. .................. 340/174 TF; 340/174 BA; 340/174 VA
[51] Int. Cl.² ........................................ G11C 11/14
[58] Field of Search ............................. 340/174 TF

[56] References Cited

UNITED STATES PATENTS

| 3,706,081 | 12/1972 | Bobeck et al. | 340/174 TF |
| 3,736,579 | 5/1973 | Marsh | 340/174 TF |

*Primary Examiner*—James W. Moffitt
*Attorney, Agent, or Firm*—Jackson E. Stanland

[57] ABSTRACT

A nucleator for producing reverse magnetized domains in an amorphous magnetic material capable of supporting such domains. The nucleator is comprised of a current carrying conductor whose current carrying path includes a portion of the amorphous magnetic medium. The amount of current which flows through the conductor and through the amorphous medium is sufficient to nucleate magnetic domains therein. The nucleator can be fabricated as a portion of magnetic elements used to move bubble domains in an amorphous magnetic material and can be implemented using single level metallurgy. Thus, a current conducting nucleator is provided in which current flows through the bubble material itself.

15 Claims, 2 Drawing Figures

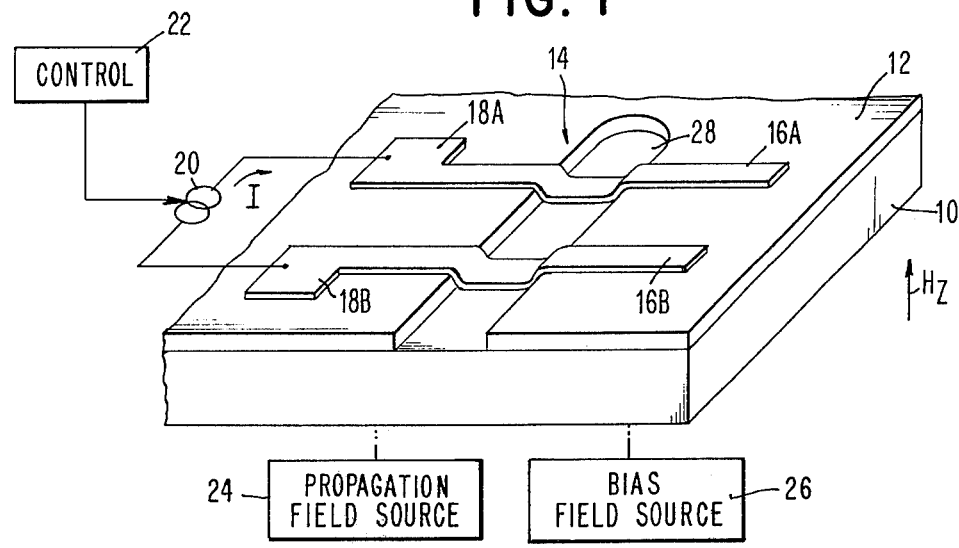

INTEGRATED BUBBLE NUCLEATOR

BACKGROUND OF THE INVENTION

1. Field of the Invention

This invention relates to nucleators for generating magnetic domains, and more particularly to a magnetic bubble domain generator which can be integrated into circuitry used to perform other functions with the magnetic bubble domains.

2. Description of the Prior Art

Many devices have been proposed in the prior art for generating magnetic bubble domains in a magnetic bubble domain material. These devices can be divided into two classes: those which generate bubble domains by replication from an existing bubble domain, and those which initially nucleate a bubble domain in the magnetic bubble material. Although many designs have been proposed for bubble domain replicator generators, such bubble generators have limitations when used at high frequencies. Therefore, bubble domain nucleators have been thought to be more preferable as the operating frequency of bubble devices has increased.

U.S. Pat. No. 3,662,359 describes a bubble domain nucleator which comprises a magnetic element for creating a localized magnetic field as well as a current carrying loop for creation of the localized magnetic field. Additionally, U.S. Pat. No. 3,706,081 describes a bubble domain nucleator in which permalloy is adjacent to the magnetic bubble material in order to produce a more intense magnetic field for nucleation of bubbles. In this latter reference, an opening is created in the insulating layer located over the bubble domain material in order to have the permalloy elements be closer to the bubble domain material.

In order to have stable bubble domain devices using bubble domains of two microns diameter or less, current carrying bubble domain nucleators become impractical due to a high current density requirement for nucleation. That is, for smaller bubble sizes, the anisotrophy of the bubble material has to be large and this in turn requires larger magnetic fields for nucleation of bubble domains in the bubble domain material. However, the need for larger magnetic fields means that larger currents will be required in the current carrying conductor of the bubble nucleator. As an example, it has been found that current carrying conductors would not nucleate two micron bubble domains in amorphous magnetic GdCoMo films at currents up to about 30 ma. This corresponds to a current density of approximately $10^7$ amps/cm$^2$. The need for large currents in the current carrying conductors comprising the bubble domain nucleators leads to electromigration problems.

The present invention seeks to provide bubble domain nucleators comprising current carrying conductors which do not suffer the problems of adverse effects due to electromigration when very small magnetic bubbles are to be nucleated. Accordingly, it has been discovered that when the nucleating current passes through the amorphous magnetic medium the current required for bubble domain nucleation is significantly less than would be if there were no current passage through the amorphous bubble medium.

Accordingly, it is a primary object of this invention to provide improved magnetic bubble domain nucleators comprised of current carrying conductors.

It is another object of this invention to provide nucleators for nucleating magnetic bubble domains in amorphous magnetic materials which are not hampered by adverse effects of electromigration.

It is another object of this invention to provide an improved bubble domain nucleator using current carrying conductors which utilizes the magnetic bubble material as a current conducting medium.

It is another object of the present invention to provide an improved bubble domain nucleator for nucleating very small bubble domains in amorphous magnetic media.

BRIEF SUMMARY OF THE INVENTION

A magnetic domain nucleator is provided for nucleating magnetic domains in amorphous magnetic materials. In contrast with other bubble domain nucleators, the present nucleator provides current passage through a portion of the magnetic medium in which the domains exist. This magnetic medium is an amorphous medium, as for example GdCoMo.

In a preferred embodiment, a current carrying conductor is formed over a magnetic spacer which is located on an amorphous magnetic bubble medium. A portion of the spacer layer is removed allowing the current carrying conductor to touch the amorphous magnetic medium. Consequently, when a current is passed through the conductor, part of the path along which the current flows will include the amorphous magnetic medium. Since these amorphous media are electrically conducting, current will flow through a portion of the amorphous medium.

It has been discovered that a current carrying nucleator which uses the amorphous magnetic medium as part of the current path is much more efficient for nucleating domains and requires less current. Consequently, such a nucleator can be used to provide very small bubble domains in an amorphous medium, thereby eliminating the electromigration problems which were heretofore present when nucleators were used to provide bubble domains of two microns diameter or less.

In another preferred embodiment, an integrated bubble domain nucleator in accordance with the present invention can be provided in a bubble domain circuit exhibiting a single level of metallization. Thus, an all NiFe bubble domain device can be provided.

These and other objects, features and advantages will be more apparent from the following more particular description of the preferred embodiments.

BRIEF DESCRIPTION OF THE DRAWINGS

FIG. 1 illustrates a bubble domain nucleator for nucleating magnetic domains in an amorphous magnetic material using reduced currents.

FIG. 2 is an embodiment of the current carrying nucleator of FIG. 1, implemented in a single level metallurgy pattern that is directly integrated with other bubble circuitry.

DETAILED DESCRIPTON OF THE PREFERRED EMBODIMENTS

FIG. 1

An amorphous magnetic material 10 has located thereover a non-magnetic spacer 12. The amorphous magnetic material is capable of supporting magnetic bubble domains and is, for example, an alloy comprised of a rare earth element and a transition metal element.

An example is GdCoMo. Such amorphous magnetic materials are described in copending application Ser. No. 581,078, filed May 27, 1975, now U.S. Pat. No. 3,965,463. These amorphous films are also described in an article by P. Chaudhari et al, which appeared in the IBM Journal of Research and Development, January 1973, at page 66.

The spacer layer 12 is a non-magnetic layer which is generally comprised of an insulator, such as $SiO_2$. Its function is to magnetically separate the bubble domain circuitry used to manipulate bubble domains and the magnetic material 10 in order to prevent adverse bubble domain nucleation therein.

A bubble domain nucleator in accordance with the present invention is comprised of current carrying conductors 16A and 16B which are located over spacer layer 12. These conductors have lands 18A and 18B to which is electrically connected a current source 20. A control unit 22 provides an input to current source 20 for triggering the appropriate current pulses in the conductors 16A and 16B.

A propagation field source 24 is used to provide the drive fields required to move magnetic bubble domains in amorphous magnetic medium 10. This source may conveniently comprise current carrying coils which are used to produce a reorienting magnetic field in the plane of medium 10. This field interacts with magnetic elements in order to provide attractive magnetic poles for the movement of the bubble domains in a manner well known in the art.

The bias field source 26 produces a magnetic field which is used to stabilize the size of the bubble domains in medium 10. This field $H_z$ is directed anti-parallel to the magnetization of the bubble domains in medium 10. It is indicated by the arrow directed normally to the plane of layer 10.

Spacer layer 12 has an opening 28 therein which exposes the underlying amorphous magnetic medium 10. Consequently, the topology of conductors 16A and 16B is such that these conductors contact the surface of magnetic layer 10 in the region of opening 28.

In operation, a bubble domain is nucleated in magnetic material 10 at a location between conductors 16A and 16B, in the region 28 of layer 12 where the spacer material is absent. To nucleate such a domain, a current pulse I is provided by source 20 which then flows into conductor 16A, through amorphous magnetic medium 10 to conductor 16B, and then back to the source 20. Consequently, the amorphous magnetic material is itself part of the current carrying path in this nucleator.

After nucleation, appropriate circuitry of a well known nature can be used to move the nucleated magnetic domain in medium 10. Subsequent application of new current pulses in the conductors will produce further bubble domains.

FIG. 2

FIG. 2 shows an embodiment of the present nucleator using a single level masking design. In this embodiment, the nucleator 14 is also part of the propagation circuitry comprising chevron elements 30 which are used to move bubble domains in response to application of a reorienting magnetic field H in the plane of magnetic medium 10. The opening 28 in the spacer layer 12 exposes the top of amorphous magnetic medium 10 in this area. Consequently, currents I flowing in either of the columns of chevrons C1 or C2 can flow to the other column through a path comprising the amorphous magnetic medium 10.

The chevron elements 30 can be comprised of a soft magnetic material, such as NiFe, as is well known in the art. The columns C1 and C2 are connected to a generator current source 32 for providing current I in either one of these chevron columns. Because the spacer layer 12 is absent in the region 28, a current in either one of these columns will propagate through the conducting magnetic medium 10 to the other column, and then return to current source 32. Also, the chevron elements in these columns C1 and C2 are used to provide attractive magnetic poles for the movement of bubble domains in the magnetic medium 10, in response to the reorientations of field H produced by the propagation field source 34. The size of bubble domains in medium 10 is determined by the materials parameters of amorphous film 10 and by the magnitude of the bias field $H_z$ which is produced by the bias field source 36. Control of the generator current source 32, propagation field source 34, and bias field source 36 is provided by control unit 38.

In accordance with principles known in the art for providing single level masking devices, a sensor S is also comprised of the propagation elements 30. Sensor S is a magnetoresistive sensor which is connected to a current source (C.S.) 40 by leads 42. The presence and absence of bubble domains in flux-coupling proximity to sensor S is indicated by the output voltage pulses V.

Provision of opening 28 in layer 12 is easily accomplished by a non-critical masking step and subsequent etching, etc., to remove the spacer material in the region 28. Thus, only a single level of metallization (NiFe) need be provided to produce a memory device having functions of write, read, and propagate.

EXAMPLES

Operation of this nucleator was tested on an amorphous magnetic film comprising GdCoMo. Two conductor nucleators were fabricated over the amorphous material. The first nucleator was comprised of a hairpin loop conductor which was totally insulated from the amorphous material by a layer of $SiO_2$, which is insulating and non-magnetic. The second nucleator was also comprised of conductors which were insulated from and separated from the amorphous magnetic medium, except in a small area where the conductors were allowed to touch the amorphous medium as is shown in FIG. 1. Currents were applied through each nucleator and the amount of current required to nucleate a domain was noted. For the conventional (first) hairpin loop nucleator which is fully insulated and separated from the amorphous magnetic medium, the current required for nucleation was approximately 200 milliamps while the current required in the second nucleator (the type shown in FIG. 1) was only about 46 milliamps. Thus, the present invention provided nucleation at a current approximately one-fourth that customarily required for the same type of nucleator having the same geometry, etc.

The conductors comprising the nucleators in this test were approximately 1 micron thick and 2½ microns wide. The spacing between the conductors in each nucleator was also 2½ microns. The results were approximately the same regardless of the spacing of the $SiO_2$ layer 12. For instance, about the same currents were required for nucleation whether the spacer layer was 500 Angstroms thick or 5,000 Angstroms thick.

The pulse width of the applied current pulses in the nucleators was generally less than about 1 microsecond. As an example, pulse widths of hundreds of nanoseconds worked satisfactorily.

The fact that nucleation does not appear to be dependent on the thickness of the spacer layer 12 and the fact that the pulse width of the applied current pulses are less than about 4 or 5 microseconds indicates that the nucleation is not caused by thermal effects as are used in thermal bubble domain nucleators. Such thermal-effect nucleators are shown, for instance, in U.S. Pat. No. 3,789,375 and in Ashkin et al. "Interaction of Laser Light with Magnetic Domains", Applied Physics Letters 21, No. 6, Sept. 15, 1972, at page 253. Rather than a thermal effect, it appears that the flow of current through the amorphous magnetic film is important in providing nucleation at low current densities. This is further indicated by the fact that elimination of the spacer layer 12 between the nucleator conductor lines and garnet bubble domain films does not produce a corresponding decrease in nucleation current. It is therefore possible that the reduction in nucleation current is related to a strong interaction between the magnetic domain walls and the nucleation current which flows through the amorphous magnetic medium. The interaction between magnetic domain walls and flowing currents is described in more detail in W. J. Carr, Jr., Journal of Applied Physics 45, 394 (1974) and S. H. Charap, Journal of Applied Physics 45, 397 (1974).

Other configurations of conductor and magnetic overlays may be used with bubble nucleators in which current is passed through the amorphous bubble domain material. The embodiments shown are only two examples of possible nucleators which employ this technique. Other designs can be readily envisioned by those of skill in the art and are within the scope of this invention.

In the practice of this invention, a current having a sufficient magnitude to nucleate a bubble domain in an amorphous magnetic material is passed through the amorphous magnetic material in a plane generally parallel to the plane of the amorphous magnetic medium. As an example of the usual magnitudes of such current, a current of about 40 milliamps flowing in the conductors mentioned in the preceding example will produce a localized magnetic field of about 50–100 Oe, when this current flows through a film of amorphous GdCoMo. Thus, in the embodiments generally shown, a planar nucleator is comprised of conductors which are typically located in a plane parallel to the plane of the amorphous bubble domain medium, but which contact the amorphous medium in a localized region so that currents will flow through a portion of the amorphous magnetic medium. These currents provide a magnetic field in the amorphous medium which is sufficient to nucleate bubbles therein. In contrast with the size of the currents generally used to provide nucleation of bubbles in amorphous materials (even for nucleators which are very close to the amorphous magnetic medium), the currents required in the present inventive nucleator are significantly less than that which would be expected. Thus, a more complicated interaction appears to be occurring leading to this unexpected result.

What is claimed is:

1. A current carrying magnetic domain nucleator for nucleating magnetic domains in an amorphous magnetic medium, comprising:

a conductor for carrying said current therethrough, said conductor having a portion thereof which is not continuous and does not provide a continuous electrical path for said current, and an electrically conducting amorphous magnetic medium capable of supporting said domains therein, said medium electrically contacting said conductor and providing a path therethrough for the flow of said current, said current having a magnitude sufficient to nucleate a magnetic domain in said amorphous magnetic medium.

2. The nucleator of claim 1, where said conductor is electrically insulated from said amorphous magnetic medium except where it contacts said magnetic medium.

3. The nucleator of claim 1, further including means for producing current through said conductor and means for producing a bias magnetic field for stabilizing the diameter of said nucleated domains.

4. The nucleator of claim 1, where said conductor is comprised of a magnetically soft material.

5. A device for nucleating magnetic domains in an amorphous magnetic medium, comprising:

at least two separate electrical conductors insulated from said amorphous magnetic medium, an electrical shunt conductor which electrically connects said two conductors, said electrical shunt being comprised of said amorphous magnetic medium and a current source for producing an electrical current in said conductors and said amorphous magnetic medium, of a magnitude sufficient to nucleate a domain in said amorphous magnetic medium.

6. The device of claim 5, further including bias means for stabilizing the size of domains nucleated in said amorphous magnetic medium.

7. The device of claim 5, where said electrical conductor is comprised of a magnetic material.

8. The device of claim 5, where said current flows in said amorphous medium plane essentially parallel to the plane of the amorphous magnetic medium.

9. The device of claim 5, further including means for propagating said nucleated domain in said amorphous magnetic medium.

10. The device of claim 9, where said propagation means is comprised of said nucleator.

11. A method for nucleating a bubble domain in an amorphous magnetic material, comprising:

passing an electrical current through a localized region of said amorphous magnetic medium in a direction substantially parallel to a surface of said amorphous magnetic medium of sufficient magnitude to nucleate a domain in said region.

12. The method of claim 11, including the further step of applying a reorienting magnetic field substantially in the plane of said amorphous magnetic medium.

13. The method of claim 11, including the further step of applying a bias field in a direction to stabilize the size of said nucleated domain.

14. The method of claim 13, including the further step of propagating said nucleated domains in said amorphous magnetic medium using the structure previously used to nucleate said domain.

15. A method for nucleating a magnetic bubble domain in an amorphous magnetic medium, comprising the steps of:

passing a current of sufficient magnitude through a portion of the surface of a localized region of said amorphous medium, and applying a magnetic field in a direction to stabilize the size of said nucleated domain.

* * * * *